United States Patent
Yang et al.

(10) Patent No.: US 8,742,542 B2
(45) Date of Patent: Jun. 3, 2014

(54) METHOD AND DEVICE FOR A DRAM CAPACITOR HAVING LOW DEPLETION RATIO

(71) Applicant: Semiconductor Manufacturing International (Shanghai) Corporation, Shanghi (CN)

(72) Inventors: Cheng Yang, Shanghai (CN); Bo Tao, Shanghai (CN); Jason Luo, Shanghai (CN); Jinganag Wu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 13/851,466

(22) Filed: Mar. 27, 2013

(65) Prior Publication Data

US 2013/0207233 A1    Aug. 15, 2013

Related U.S. Application Data

(62) Division of application No. 13/078,917, filed on Apr. 1, 2011, now Pat. No. 8,426,286.

(30) Foreign Application Priority Data

Apr. 14, 2010   (CN) .......................... 2010 1 0154714

(51) Int. Cl.
    *H01L 21/02*    (2006.01)
(52) U.S. Cl.
    USPC ................. 257/532; 257/296; 257/E29.002; 257/E29.343; 257/E21.008; 257/E21.013

(58) Field of Classification Search
    USPC ................. 257/532, 296, E29.002, E29.343, 257/E21.008, E21.013; 438/381, 398, 255
    See application file for complete search history.

(56) References Cited

U.S. PATENT DOCUMENTS

| | | | |
|---|---|---|---|
| 6,440,795 B1 | 8/2002 | Harshfield | |
| 6,632,721 B1 * | 10/2003 | Iijima et al. | 438/398 |
| 8,426,286 B2 | 4/2013 | Yang et al. | |
| 2001/0000492 A1 * | 4/2001 | Figura | 438/256 |
| 2006/0141698 A1 * | 6/2006 | Weimer | 438/240 |

OTHER PUBLICATIONS

Restriction Requirement for U.S. Appl. No. 13/078,917 mailed on Dec. 11, 2012, 5 pages.
Notice of Allowance for U.S. Appl. No. 13/078,917 mailed on Apr. 1, 2011, 8 pages.

* cited by examiner

*Primary Examiner* — Tu-Tu Ho
(74) *Attorney, Agent, or Firm* — Kilpatrick Townsend & Stockton LLP

(57) ABSTRACT

A method of manufacturing a semiconductor integrated circuit device having low depletion ratio capacitor comprising: forming hemispherical grains (HSG) on a poly-silicon; doping the hemispherical grained polysilicon in a phosphine gas; and rapid thermal oxidizing the doped hemispherical grained polysilicon at 850° C. for 10 seconds. The method further comprises nitridizing the rapid thermal oxidized hemispherical-grained polysilicon and depositing a alumina film on the silicon nitride layer. A semiconductor integrated circuit device having a low depletion ratio capacitor according to the disclosed manufacturing method is provided.

6 Claims, 5 Drawing Sheets

| flow | condition | (Conventional) common 515 | Embodiment 1 high pressure 520 | Embodiment 2 high temperature 525 | Embodiment 3 common+RTO 530 |
|---|---|---|---|---|---|
| | HSG doping PH3 | 650C 2hrs 6.5Torr | 650C 2hrs 200Torr | 700C 30min 6.5Torr | 650C 2hrs 6.5Torr +RTO 850C 10s |
| | HSG Nitridation | 650C 3hrs | 650C 3hrs | 650C 3hrs | 650C 3hrs |
| | Al2O3 Deposition | 45A | 45A | 45A | 45A |
| 550 | CAP-H | 32.92 | 35.24 | 36.65 | 35.75 |
| 552 | CAP-L | 26.55 | 30.91 | 32.02 | 32.73 |
| 555 | Depletion Ratio | 19.35 | 13.67 | 12.63 | 8.43 |
| 560 | CAP1KGP | 9.516 | 9.592 | 2.111 | 1.939 |
| 562 | CAP1KGN | 16.998 | 18.950 | 4.555 | 4.323 |
| 570 | CAPBV | 2.501 | 2.508 | 2.525 | 2.542 |
| WAT | BRGMLL | 196 | 233 | 251 | 275 |
| | RCM1PLT218 | 44.43 | 42.66 | 45.62 | 45.44 |
| | RCM1PLT | 40.89 | 40.61 | 42.71 | 42.56 |
| | RCM1PLT255 | 39.48 | 40.10 | 41.05 | 40.95 |
| | RCM1PLT281 | 40.03 | 39.23 | 44.50 | 42.32 |
| | RCM1P2L218 | 1.762 | 2.623 | 2.173 | 1.377 |

FIG. 5

METHOD AND DEVICE FOR A DRAM CAPACITOR HAVING LOW DEPLETION RATIO

CROSS-REFERENCES TO RELATED APPLICATIONS

This application is a divisional of U.S. patent application Ser. No. 13/078,917 filed Apr. 1, 2011, which claims priority to Chinese Patent No. 201010154714.X, filed Apr. 14, 2010, commonly assigned and hereby incorporated by reference in their entirety for all purposes.

BACKGROUND OF THE INVENTION

The present invention is directed to integrated circuits and their processing for the manufacture of semiconductor devices. More particularly, the invention provides a method of manufacturing a semiconductor integrated circuit device including a high surface area capacitor with a low depletion ratio. Merely as an example, an embodiment provides a method for a semiconductor integrated circuit device including a rapid thermal process after phosphorous doping of a hemispherical grained poly-silicon film.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout ("design rules") needs to be changed. An example of such a limit is the amount of charge stored within a capacitor formed on the surface of a semiconductor device, given the low operating voltage of the semiconductor integrated circuit device due to its small geometry. The surface area of the storage determines the amount of charge that can be stored on the capacitor.

The manufacturing of integrated circuits involves various processes. For example, the processes include, inter alia, wafer growth, photolithography, doping, oxidation, deposition, etc.

Semiconductor devices and circuits are formed in wafers, which serve as substrates. Generally, single-crystal substrates, which are made from a single material with crystals formed by atoms all aligned in a specific direction. The process of wafer creation usually involves creating a large ingot of semiconductor materials, aligning the ingot, removing impurities, slicing ingot into thin wafers, and polishing the sliced wafers.

Generally, photolithography process is used to define and shape specific areas of the wafer to suit particular design of integrated circuit. Usually, a layout design is used to create an optical mask (or reticle pattern, depending on application). The wafer surface is usually covered with a layer of photoresist. The wafer is then exposed to light through the optical mask. After light exposure, the areas of photoresist that were exposed to light are removed using chemical process. As a result, the wafer contains both clear areas (where photoresist is removed) and areas blocked by photoresist. Next, various processes (such as etching, oxidation, diffusion, etc.) only affecting clear areas are performed. After various process are finished, photoresist materials are then removed.

One of the various processes is oxidation, which is used to create insulating layers. Often, oxide grows on silicon in a wafer to form dielectrics made of $SiO_2$. One of the method to grow oxide on wafer is exposing wafer to $O_2$ at high temperatures.

Deposition is another process in semiconductor fabrication. Deposition provides connections among insulators and interconnecting layers by depositing various materials. Techniques such as chemical vapor deposition (CVD) and low pressure CVD (LPCVD) are commonly used. For example, metals are deposited to provide low resistance interconnects, polysilicon is used as conductor, and dielectric materials are deposited to create insulating layers.

Another process is doping, which changes the electrical properties of the wafer. For example, a specific area of the wafer may be doped and become n-type or p-type depending upon the doping material and concentration. There are a few ways to perform doping. One way is implantation, in which atoms are injected into wafers at high velocity. Another way of doping is through diffusion, in which atoms are diffused into selected regions of the wafer at high temperature.

For semiconductor memories of the dynamic random access types, i.e., "DRAMs," information is stored by varying the amount of charge within each capacitor of an array of capacitors formed on the surface of a semiconductor substrate. For example, a bit (binary information) is stored at each capacitor by associating a discharged capacitor state with a logical zero and a charged capacitor state with a logical one. Reducing the size of a DRAM capacitor with reduced design rules reduces the surface area of the capacitor plates and therefore has the effect of reducing the amount of charge stored on the capacitor. In addition, the reduced surface area can degrade capacitor storage performance at low voltages.

A capacitor generally consists of two conducting plates placed in parallel separated by an insulator. The plates can be formed by two electrodes having a planar, cylindrical, or deep-trench surfaces. Applying a voltage differential to the electrodes charges the capacitor, where the surface of the electrodes will take on equal and opposite charges. The capacitor is fully charged when the voltage difference between the two electrodes is equal to the power supply voltage. If the capacitor is perfect, it will hold the stored voltage for an infinite time. Due to the leakage current inherent in a capacitor, the capacitor must be periodically recharged (refreshed) in order to keep the stored binary information. Therefore, the frequency of recharging (i.e., refresh rate) depends on the amount of stored charge and the amount of leakage current in the capacitor.

Conventional capacitor structures have been widely used in integrated circuit applications, such as DRAM. However, these capacitor structures have various limitations, some of which are described in more detail below.

Therefore, it is desirable to have improved methods of forming a semiconductor capacitor in the manufacturing of integrated circuits.

BRIEF SUMMARY OF THE INVENTION

It has been found that the capacitor value varies depending on the polarity of the charge voltage. A depletion ratio is defined as the difference between C+ and C− divided by C+, where C+ is the capacitor value when the electrodes are biased with a positive voltage, and C− is the capacitor value when the electrodes are biased with a negative voltage. The depletion ratio is thus expressed as:

$$DR=100*(C+-C-)/C+ \text{ or } 100*(1-C-/C+) \quad (1)$$

In conventional manufacturing methods, the capacitor value at a negative voltage is much less than the value when the capacitor is biased at a positive voltage. This variation in capacitance values is not desired in device applications. Additionally, in DRAM applications, various methods have been proposed to increase the effective capacitor surface area without increasing the die size. These methods, including hemispherical-grain (HSG) silicon, often involve complicated processing and can exacerbate depletion effects in the capacitor. Accordingly, the depletion ratio of conventional integrated circuit capacitors can be relatively high. In DRAM applications, the variation in capacitance can impact device performance and, in some cases, frequent charge refresh operation is required.

The present invention is directed to integrated circuits and their processing for the manufacture of semiconductor devices. More particularly, the invention provides a method of manufacturing semiconductor integrated circuit devices having at least a low depletion ratio capacitor. Merely by way of example, the invention has been applied to the DRAM fabrication process having a capacitor depletion ratio less than 10. But it would be recognized that the invention has a much broader range of applicability.

Embodiments of the present invention provide many benefits over conventional techniques. For example, embodiments of the present technique provide an easy to use process that relies upon conventional technology. In some embodiments, a method provides enlargement of the surface area of the lower electrode using hemispherical grains. Further, the method provides a low depletion ratio, i.e., the capacitor value varies within a relatively narrow range where the lower electrode is biased either positively or negatively relative to the upper electrode. Additionally, the method provides a process that is compatible with conventional process technology without making substantial modifications to conventional equipment and processes. Depending upon the embodiment, one or more of these benefits may be achieved. These and other benefits will be described in more detail throughout the present specification and more particularly below.

According to an embodiment of the present invention, a method includes forming a polysilicon layer on the silicon substrate and forming hemispherical grains (HSG) on the polysilicon layer. The method further includes doping the HSG formed polysilicon in a 200 Torr pressure gas atmosphere containing phosphine ($PH_3$) at a temperature in the range of 600° C. to 700° C. for a time duration of 2 hours. Additionally, the method includes nitridizing the doped HSG polysilicon and depositing an alumina film having a thickness of about 45 Å.

According to another embodiment of the present invention, a method includes forming a polysilicon layer on the silicon substrate and forming hemispherical grains (HSG) on the polysilicon layer. The method further includes doping the HSG formed polysilicon in a gas atmosphere containing a phosphine gas ($PH_3$) at a designated temperature in the range of 650° C. to 750° C. for a designated time period. In an embodiment, the designated temperature is about 700° C., the pressure is about 6.5 Torr, and the time period is about 30 minutes. In another embodiment, the designated temperature is about 650° C., the pressure is about 200 Torr, and the time duration is about 120 minutes.

According to yet another embodiment of the present invention, a method includes forming a polysilicon layer on the silicon substrate and forming hemispherical grains (HSG) on the polysilicon layer. The method further includes doping the HSG formed polysilicon in a low pressure gas atmosphere containing a phosphine gas ($PH_3$) at a temperature in the range of 620° C. to 680° C. for a time duration about 2 hours. After the doping of HSG-formed polysilicon is performed, a rapid thermal oxidation process is applied to the doped HSG polysilicon at a temperature in the range of 800° C. to 900° C. (preferably about 850° C.) for a time duration of 5 seconds to 15 seconds (preferably 10 seconds). And the rapid thermal oxidation process is followed by a nitration process to form a $Si_xO_yN_z$ film. An alumina film having a thickness of 45 Å will then be deposited on the $Si_xO_yN_z$ film.

In some embodiments of the present invention, a semiconductor device having a low depletion ratio capacitor includes a surface having hemispherical-grained silicon for increasing a surface area. In some embodiments, the depletion ratio of the capacitor is below 10. In certain embodiments, the hemispherical-grained silicon is doped in an atmosphere containing a phosphine gas ($PH_3$), and a silicon oxide film is formed on the hemispherical-grained silicon through a rapid thermal oxidation process at a temperature in the range of 800° C. to 900° C. (preferably about 850° C.) for a time duration of 5 seconds to 15 seconds (preferably 10 seconds). In some embodiments, the semiconductor device further includes a silicon oxynitride layer $Si_xO_yN$, formed on the silicon oxide film. Additionally, an alumina film $Al_2O_3$ having a thickness in the range of 30 Å to 60 Å is deposited on the alumina film. In an embodiment, the alumina film thickness is about 45 Å.

Various additional features and advantages of the present invention can be more fully appreciated with reference to the detailed description and accompanying drawings that follow.

BRIEF DESCRIPTION OF THE DRAWINGS

FIG. 5 is a Table summarizing some experimental results obtained from the embodiments illustrated in FIG. 1 to FIG. 4.

DETAILED DESCRIPTION OF THE INVENTION

The present invention will now be described more fully hereinafter with reference to the accompanying drawings, in which embodiments of the present invention are shown. This invention may be embodied in different forms and should not be construed as limited to the embodiments set forth herein. It is noted that the thickness of layers and regions are not drawn to scale, and exaggerated for clarity. It is also understood that when a layer is referred to as being on another layer, it can be directly on the other layer, or intervening layers may also be present.

Figure 1:
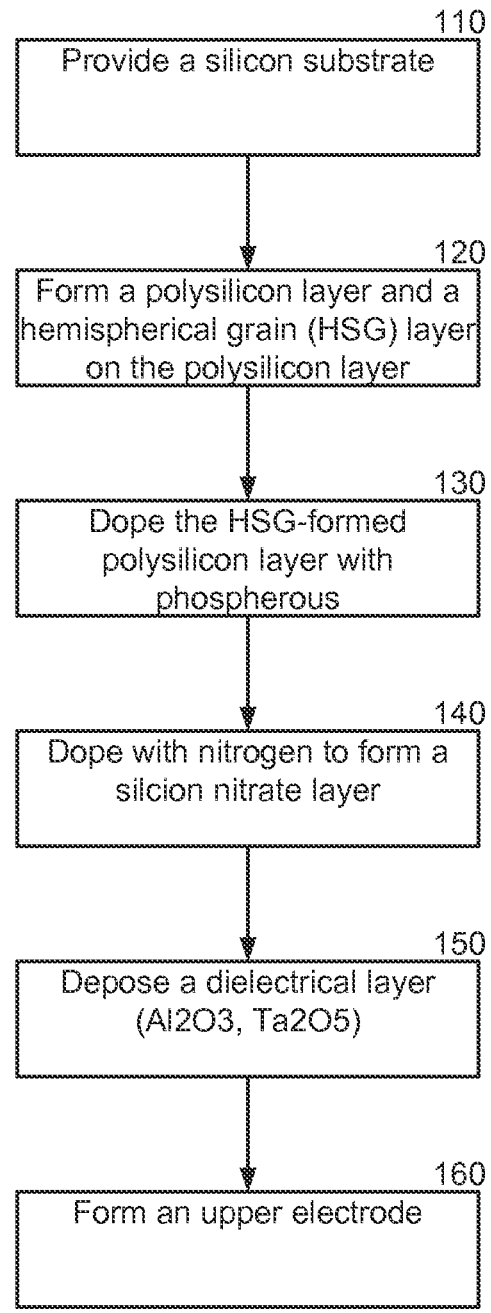
FIG. 1 is a flow chart illustrating methods of manufacturing a semiconductor integrated circuit device according to embodiments of the present invention.

FIG. 1 shows methods of manufacturing a semiconductor integrated circuit device according to some embodiments of the present invention. The flow chart of FIG. 1 may be best understood together with FIG. 2, which shows a cross-section of a semiconductor integrated device being manufactured according to methods described in the flow chart illustrated in FIG. 1. In one embodiment of the invention, a silicon substrate 210 is provided at step 110. A conductive layer pattern 220 (e.g., polysilicon) having a first conductivity type impurity (e.g., n-type) may be formed directly on the silicon substrate. The polysilicon layer 220 may be the lower electrode of a capacitor. Hemispherical grains 230 are formed on the polysilicon layer to increase the surface area of the conductive layer pattern 220. In one embodiment, the HSG layer 230 may be formed by loading the polysilicon 220 into a reaction chamber and maintaining a low pressure of about 6.5 Torr while simultaneously exposing the conductor layer pattern 220 to a phosphine ($PH_3$) gas at a temperature between 600° C. to 700° C. (preferably 650° C.) for a time duration of about 120 minutes (step 130). In another embodiment, the phosphorous doping of the HSG-formed polysilicon layer 220 is performed under a $PH_3$ gas pressure of about 200 Torr at a temperature in the range of about 620° C. to 680° C. for a time duration of 120 minutes.

After doping of the composite polysilicon pattern layer (including the HSG layer 230 and polysilicon pattern layer 220), a diffusion barrier layer 240 is formed on the HSG layer 230 at step 140. Here, a nitrogen gas is provided to react with the surface of the HSG layer 230 to form a silicon nitrite layer 240. The nitration process may be performed at a temperature between 600° C. and 700° C. (preferably 650° C.) for a duration of 180 minutes. Following the formation of the silicon nitride layer 240, a dielectric layer 250 is formed on the silicon nitride layer. In an embodiment, the dielectric layer comprises a high dielectric material such as aluminum oxide $Al_2O_3$, tantalum oxide $Ta_2O_5$ having a thickness about 45 Å. At step 160, an upper electrode 260 is formed.

As determined by the inventors herein, semiconductor integrated circuit devices manufactured according to the above described methods provide improved characteristics in term of the depletion ratio. Experimental results are shown in FIG. 5. Column 515 (Conventional) provides measured values obtained in a conventional manufacturing process. Here, the ratio between a low capacitor value (when the electrodes are reversed biased) and a high capacitor value (when the electrodes are positively biased) is 0.8065 (26.55 in row 552 divided by 32.92 in row 550) for a depletion ratio of 19.35 (row 555) according to Equation (1).

Figure 2:
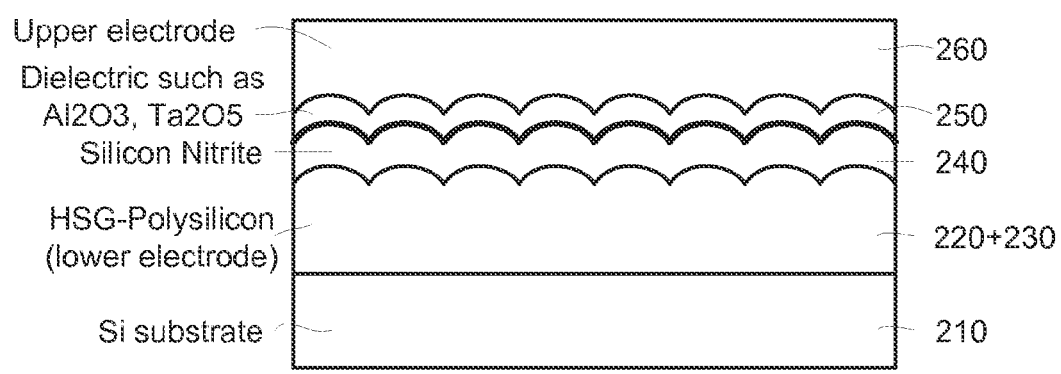
FIG. 2 is a cross-sectional illustration of an integrated device having a hemispherical grain conductor/electrode therein formed in accordance with the methods shown in FIG. 1.

Column 520 (Embodiment 1) shows experimental results according to an embodiment of the present invention described in FIG. 1 and FIG. 2 above. Here, the conductor layer pattern 220 and the HSG layer 230 are exposed to a phosphine ($PH_3$) gas under a pressure of about 200 Torr while the process temperature and time duration are about the same as in the conventional manufacturing method. An improved depletion ratio of 13.67 has been obtained comparing with the depletion ratio of 19.35 in the convention method in spite of a slightly higher leakage current in the P- (row 560) and N-MOS (row 562) transistors.

Column 525 (Embodiment 2) shows experimental results according to another embodiment of the present invention described in FIGS. 1 and 2. Here, the polysilicon layer pattern 220 and the HSG layer 230 are exposed to a phosphine ($PH_3$) gas under a pressure of about 6.5 Ton similar to the conventional method while the process temperature is increased to 700° C. for a time duration of about 30 minutes. It is noted that the achieved depletion ratio is now around 12.63, significantly lower than that of the conventional method in column 515. It also is noted that the leakage current of the P- and N-MOS transistors are also significantly lower than those obtained in the conventional method. And the breakdown voltage (row 570) is also slightly better than that of the conventional method.

Figure 3:
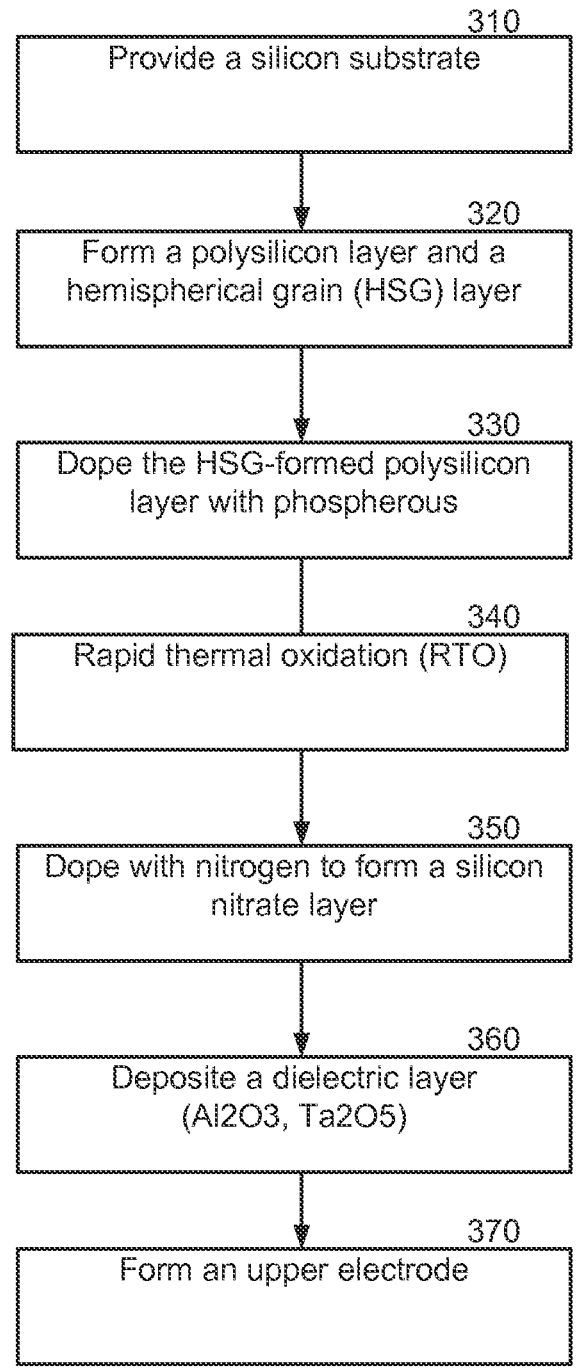
FIG. 3 is a flow chart illustrating a method for manufacturing a semiconductor integrated circuit device according to another embodiment of the present invention.
Figure 4:
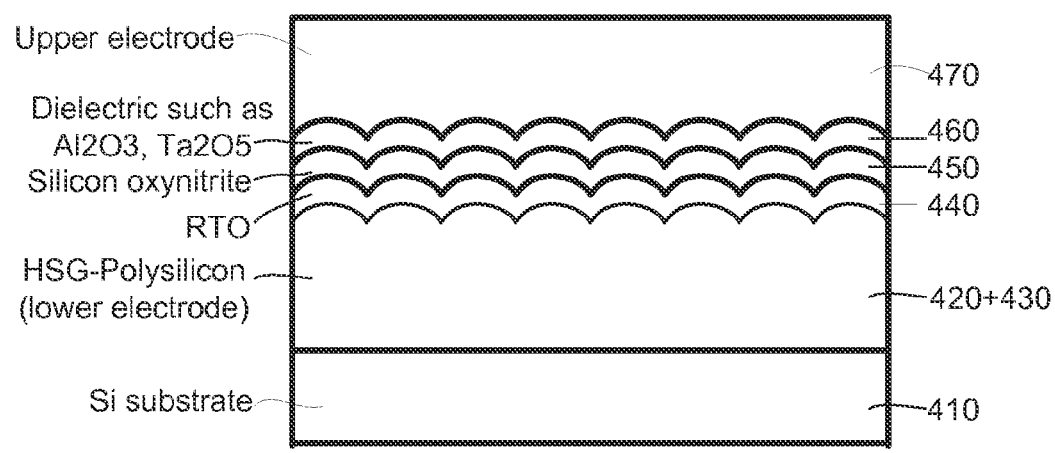
FIG. 4 is a cross-sectional illustration of an integrated device having a hemispherical grain conductor/electrode therein formed in accordance with the method shown in FIG. 3.

Shown in FIG. 3 is a flow chart according to still another embodiment of the present invention. In this embodiment, a rapid thermal oxidation (RTO) will be performed on the HSG-formed polysilicon before the nitration step in order to further improve the depletion ratio. In some embodiments, the RTO steps provides a control thermal oxide formation to pacify the surface of the HSG-formed polysilicon without causing substantial dopant redistribution. The flow chart shown in FIG. 3 is described together with the associated cross-sectional illustration shown in FIG. 4.

At step 310, a silicon substrate 410 is provided. A conductive layer pattern 420 (e.g., polysilicon) having a first conductivity type impurity (e.g., n-type) may be formed directly on the silicon substrate. In an embodiment, the first conductivity type impurity is phosphor. The polysilicon layer 420 may be the lower electrode of a capacitor. Hemispherical grains 430 are formed on the polysilicon layer to increase the surface area. Phosphorous doping is performed on the hemispherical grains at step 330. In one embodiment, the phosphorous doping may be performed by loading the composite polysilicon 420 including hemispherical grains 430 into a reaction chamber and maintaining a low pressure of about 6.5 Torr containing a phosphine ($PH_3$) gas at a temperature between 600° C. to 700° C. (preferably 650° C.) for a time duration of about 120 minutes. Following the $PH_3$ annealing, a rapid thermal oxidation is performed on the phosphor-doped and HGS-formed polysilicon at step 340. The RTO process at step 340 can be performed at a temperature ranging from 800° C. and 900° C. for a time period between 6 seconds to 15 seconds. In a preferred embodiment, the RTO step 340 is performed in a heated chamber filled with about 8% $O_2$ at a temperature of 850° C. for 10 seconds to form a silicon oxide layer on the HGS polysilicon.

At step 350, the HGS-formed polysilicon having a silicon oxide layer 440 is submitted to an inert gas such as nitrogen for a time duration of 180 minutes at a temperature in the range between 600° C. and 700 C. A silicon oxynitride layer 450 of $Si_xO_yN$ is then formed on the phosperous-doped HSG-formed polysilicon. Following the HSG nitridation step 350, a dielectric layer 460 is formed on the silicon oxynitride layer 450 at step 360. In an embodiment, the dielectric layer comprises a high dielectric material such as aluminum oxide $Al_2O_3$, tantalum oxide $Ta_2O_5$ having a thickness about 45 Å. In en embodiment, the thickness of the $Al_2O_3$ is about 45 Å. At step 370, an upper electrode 470 is formed on the dielectric layer 460.

As it can be seen in the experimental results shown in FIG. 5, the additional rapid thermal oxidation step inserted between the HSG-doping with a phosphine ($PH_3$) gas and the nitridation improves the depletion ratio of the capacitor and the leakage current of the MOS transistors. The measured capacitor value with a positive biased voltage (e.g., the lower electrode is at 0V, and a positive voltage is applied to the upper electrode) is 35.75 pF, i.e., higher than the capacitor value manufactured with the conventional method. The capacitor value is even higher when the capacitor is reversed biased (the lower electrode at ground potential, and a negative voltage is applied to the upper electrode) when comparing with the value obtained with the capacitor manufactured with the conventional method. For example, the capacitor value of conventional device is 26.55 pF (row 552, column 515), and the capacitor value of Embodiment 3 is 32.75 pF (row 552, column 530 in FIG. 5). Because the difference in capacitor values between the positive and negative biased capacitor is small in the present invention, a much small depletion ratio is obtained. According to FIG. 5, the positive biased capacitor value CAP-H is 35.75 (row 550, column 530) and the negative biased value CAP-L is 32.75 (row 560, column 530), the ratio CAP-H/CAP-L is about 0.9155, and the depletion ratio is 8.43 (row 555, column 530) according to Equation (1). When compared with the depletion ratio of 19.35 of the conventional art, the depletion ratio of Embodiment 3 of the present invention shows significant improvement. It is further observed that the leakage currents of the manufactured P- and N-MOS transistors according to Embodiment 3 of the present invention are also significant lower than those of the convention art (rows 560, 570 and column 530 of FIG. 5). Additionally, the breakdown voltage (row 570) is higher than that of the conventional method.

It will be understood that the examples and embodiments described herein are for illustrative purposes only and that various modifications or changes can be made without departing from the spirit of the present invention. For example, the polysilicon layer may take on other shapes rather than planar. In order to increase the surface area, the polysilicon layer may include a trench or a cylinder, or the polysilicon layer may be formed pn a surface of a silicon pillar.

Those skilled in the art will recognize that the embodiments described in the specification may be altered and modified without departing from the spirit and scope of the invention as defined in the following claims.

What is claimed is:

1. A semiconductor device comprising a low depletion ratio capacitor having a hemispherical-grained silicon as an electrode, the semiconductor device comprising;
   a silicon substrate;
   an n-type polysilicon layer on the silicon substrate;
   phosphorous doped hemispherical grains on the polysilicon layer;
   a diffusion barrier layer on the hemispherical grains;
   a dielectric layer on the diffusion barrier layer, the dielectric layer having a thickness of about 45 angstroms; and
   an upper electrode on the dielectric layer,
   wherein the low depletion ratio is below 10.

2. The semiconductor device of claim 1 wherein
   the dielectric layer comprises a material selected from the group consisting of aluminum oxide and tantalum oxide.

3. The semiconductor device of claim 1 wherein the polysilicon layer has a planar surface.

4. The semiconductor device of claim 1 wherein the polysilicon layer comprises a trench.

5. The semiconductor device of claim 1 wherein the the diffusion layer is a silicon nitride layer.

6. The semiconductor device of claim 1 wherein the diffusion layer is a silicon oxynitride layer.

* * * * *